US009018750B2

(12) United States Patent
Forcier et al.

(10) Patent No.: US 9,018,750 B2
(45) Date of Patent: Apr. 28, 2015

(54) THIN FILM STRUCTURE FOR HIGH DENSITY INDUCTORS AND REDISTRIBUTION IN WAFER LEVEL PACKAGING

(75) Inventors: Robert Forcier, Mesa, AZ (US); Douglas Scott, Phoenix, AZ (US)

(73) Assignee: Flipchip International, LLC, Phoenix, AZ (US)

( * ) Notice: Subject to any disclaimer, the term of this patent is extended or adjusted under 35 U.S.C. 154(b) by 0 days.

(21) Appl. No.: 13/572,376

(22) Filed: Aug. 10, 2012

(65) Prior Publication Data

US 2013/0037956 A1 Feb. 14, 2013

Related U.S. Application Data

(60) Provisional application No. 61/522,628, filed on Aug. 11, 2011.

(51) Int. Cl.
| H01L 27/00 | (2006.01) |
| H01L 23/538 | (2006.01) |
| H01L 23/522 | (2006.01) |
| H01L 23/532 | (2006.01) |
| H01L 23/00 | (2006.01) |
| H01L 23/525 | (2006.01) |

(52) U.S. Cl.
CPC ........ *H01L 23/5389* (2013.01); *H01L 23/5227* (2013.01); *H01L 23/525* (2013.01); *H01L 23/53223* (2013.01); *H01L 24/19* (2013.01); H01L 2224/12105 (2013.01); H01L 2924/1461 (2013.01)

(58) Field of Classification Search
USPC .......... 257/737, 738, E23.021, E23.069, 621, 257/735, 736, 750, 751, 753, 761–763, 764, 257/780, 781; 438/612–617, 648
See application file for complete search history.

(56) References Cited

U.S. PATENT DOCUMENTS

| 7,429,779 B2 * | 9/2008 | Itoi et al. ....................... 257/528 |
| 7,435,619 B2 | 10/2008 | Shim et al. |
| 7,576,436 B2 | 8/2009 | Chih-Pinhung |
| 7,781,877 B2 * | 8/2010 | Jiang et al. .................... 257/686 |
| 8,415,789 B2 * | 4/2013 | Ishihara ........................ 257/723 |
| 2004/0040855 A1 | 3/2004 | Batinovich |
| 2006/0103020 A1 | 5/2006 | Tong et al. |
| 2007/0241460 A1 * | 10/2007 | Mis et al. ...................... 257/764 |

OTHER PUBLICATIONS

WIPO Search Report and Written Opinion dated Feb. 28, 2013 for corresponding Application No. PCT/ US2012/050382; 12 sheets.

* cited by examiner

*Primary Examiner* — Jasmine Clark
(74) *Attorney, Agent, or Firm* — Arno T. Naeckel

(57) ABSTRACT

Disclosed is a package that includes a wafer substrate and a metal stack seed layer. The metal stack seed layer includes a titanium thin film outer layer. A resist layer is provided in contact with the titanium thin film outer layer of the metal stack seed layer, the resist layer forming circuitry. A method for manufacturing a package is further disclosed. A metal stack seed layer having a titanium thin film outer layer is formed. A resist layer is formed so as to be in contact with the titanium thin film outer layer of the metal stack seed layer, and circuitry is formed from the resist layer.

30 Claims, 6 Drawing Sheets

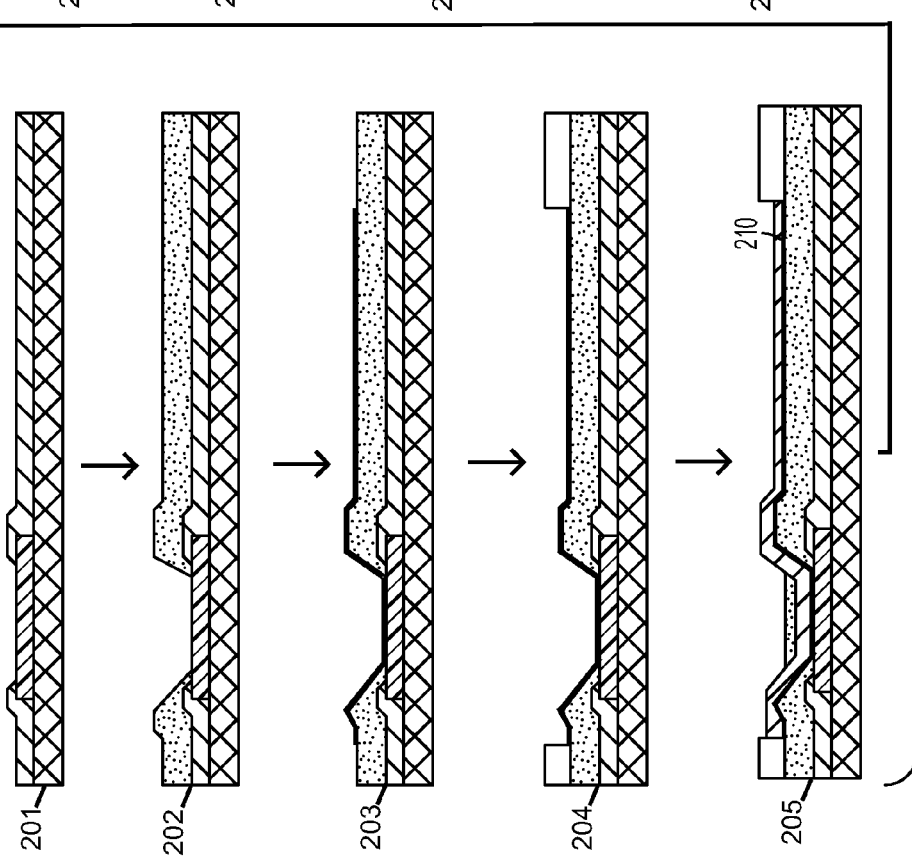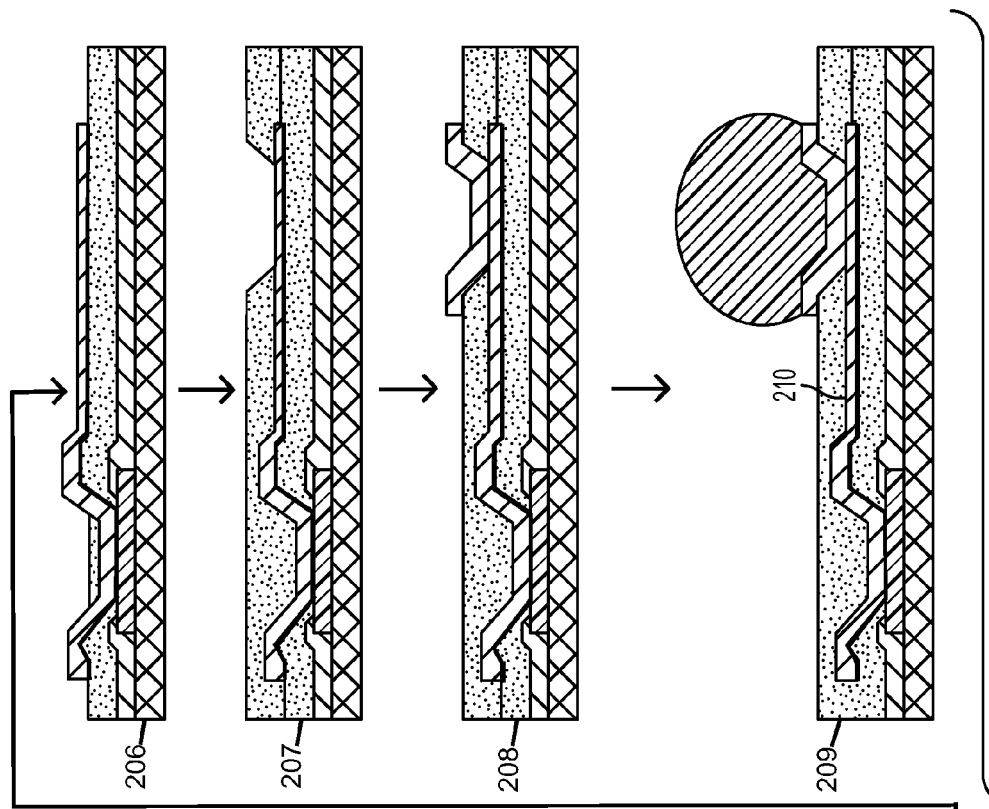
FIG. 2

THIN FILM STRUCTURE FOR HIGH DENSITY INDUCTORS AND REDISTRIBUTION IN WAFER LEVEL PACKAGING

This application claims priority to U.S. Provisional Patent Application Ser. No. 61/522,628, filed Aug. 11, 2011, which is incorporated herein by reference in its entirety.

This application includes material which is subject to copyright protection. The copyright owner has no objection to the facsimile reproduction by anyone of the patent disclosure, as it appears in the Patent and Trademark Office files or records, but otherwise reserves all copyright rights whatsoever.

FIELD

The present disclosure generally relates to a structure and method for semiconductor devices, and more particularly to a structure and method for electronic wafer-level chip-scale packaging and flip-chip packaging and assembly.

BACKGROUND

In wafer level packaging, circuitry is formed additively to wafers using a variety of metal deposition, lithography and metal etching processes. This circuitry can provide electrical continuity for individual circuit functions and can also provide passive device structures such as inductors and antennas.

Redistribution (RDL) is a type of circuitry that is utilized in wafer level packaging for providing flexibility on the location of bump interconnects in positions other than the original pads on the device. For example, a circuitry pattern typical of the RDL application is illustrated in FIG. 1 with the original pad location 120 and the final pad location 100 connected with a metal conductor RDL line 140. A space between the lines is indicated 160 along with an RDL line 140 and an inductor circuit 180. By relocating the pads, the die can be assembled on lower cost printed circuit boards and with more common mass production assembly equipment. Smaller geometries are desirable in redistribution and other types of circuitry to achieve miniaturization and smaller mechanical envelopes in the final assembly.

Circuitry is placed on the chips/devices while they are still in wafer form utilizing either an electroplating process or a physical vapor deposition process (PVD or sputtering). The width of the circuit lines formed during the subsequent deposition, lithography and etching processes are typically 10 to 20 microns in width and the spacing between the lines is typically 10-20 microns.

Applying circuitry by electroplating is a slow and expensive process and requires several steps including an initial PVD step of applying a seed layer of about 0.1 to 1 micron thickness that is eventually electroplated to a thicker metal thickness typically of 5 microns to 10 microns depending on the application resulting in both circuit lines and circuit spaces. FIG. 2 illustrates an exemplary process for forming an RDL circuitry structure 210 using an electroplating approach. The incoming wafer is shown at process steps 201. A structure resulting from first dielectric deposition and patterning steps are shown at 202. Next, a sputtered seed layer is deposited. The structure resulting from sputtered seed layer deposition is shown at 203. Plating resist deposition and patterning steps are illustrated at 204. An RDL copper electroplating step results in the structure illustrated at 205. The resist is then stripped and a seed layer is etched, resulting in the structure shown at 206. A second dielectric deposition and patterning step is then performed, resulting in the structure shown at 207. An under bump metal processing step is then performed, resulting in the structure shown at 208. Subsequently, metal spheres are attached, resulting in the structure illustrated at 209. Achieving circuit spaces of high resolution below 10 microns is possible because the plating is formed in photoresist channels and then the initial seed layer is etched away with minimal side wall non-uniformity. However achieving circuit lines of high resolution below 10 microns is more challenging because of the photoresist resolution.

Applying circuitry by sputtering or PVD is a lower cost, faster process because it does not need the secondary electroplating step and the lines and spaces are formed in the original seed layer which has a typical thickness of 1 to 2 microns. FIG. 3 illustrates an exemplary process for forming an RDL circuitry line 310 with a typical metal stack structure 320 using a PVD approach. With reference to the structure shown at 301, the first dielectric layer ("Polymer 1") is coated, and the wafer is exposed, developed and cured. In a subsequent step illustrated by the structure shown at 302, the metal redistribution seed layer is sputtered with aluminum, nickel vanadium, and copper pattern and etched to form redistribution and inductor runners. At a subsequent step illustrated by the 303, a second dielectric layer ("Polymer 2") is coated, and the wafer is exposed, developed and cured. Subsequently, metal spheres are attached, as is illustrated at 304. Circuitry formed by PVD is limited to 10-20 micron lines and spaces due to proper adhesion of the photoresist to the seed layer which is needed during the etch process for high yields.

SUMMARY

One or more embodiments of the present disclosure are directed to enabling the formation of higher density circuits for inductors, antennas, rotors, coil structures, MEMs structures, and redistribution (RDL) circuitry utilized in wafer level and flip chip packaging with increased yields.

In an embodiment, the invention provides a package that includes a wafer substrate and a metal stack seed layer. The metal stack seed layer includes a titanium thin film outer layer. A resist layer is provided in contact with the titanium thin film outer layer of the metal stack seed layer, the resist layer forming circuitry.

In an embodiment, the invention provides a method for manufacturing a package. A metal stack seed layer having a titanium thin film outer layer is formed. A resist layer is formed so as to be in contact with the titanium thin film outer layer of the metal stack seed layer, and circuitry is formed from the resist layer.

The invention in an embodiment provides a metal stack structure for high density formation of circuitry utilizing titanium metal as a top layer of the metal stack to promote adhesion during the subsequent photoresist and polymer coating operations, and to promote long term reliability of wafer level packaging for inductors, antennas, rotors, coil structures, MEMs structures, and redistribution applications. The methods described herein can be used to construct various shaped complex interconnect structures including but not limited to circular, rectangular, octagonal, etc. The methods described herein can provide high yields when forming interposers and 3D structures for stacking multiple die or discrete die in the same package. The methods described herein can provide high yields when forming embedded die structures for fan-out and other multi-die, multi-discrete 3D packages where the wafer level package is embedded in a printed circuit, a module, a packaging substrate or a flex circuit.

BRIEF DESCRIPTION OF THE DRAWINGS

The foregoing and other objects, features, and advantages of the invention will be apparent from the following more particular description of preferred embodiments as illustrated in the accompanying drawings, in which reference characters refer to the same parts throughout the various views. The drawings are not necessarily to scale, emphasis instead being placed upon illustrating principles of the invention.

FIG. 2 illustrates an RDL circuitry structure 210 formed by an electroplating approach.

DETAILED DESCRIPTION

One or more embodiments of the present disclosure are directed to an improved, reliable and manufacturable method of achieving high yields on additive circuitry with the faster and thinner PVD process for wafer level packaging. In one or more embodiments, the improved method provides a means to significantly simplify the manufacturing flow and reduce the cost of manufacturing by the use of a titanium thin film adhesion layer on the metal stack comprising the seed layer. This titanium film remains with the circuitry in the final product and typically has a thickness of about 250 angstroms, but can have various thicknesses depending on the application.

Figure 1:
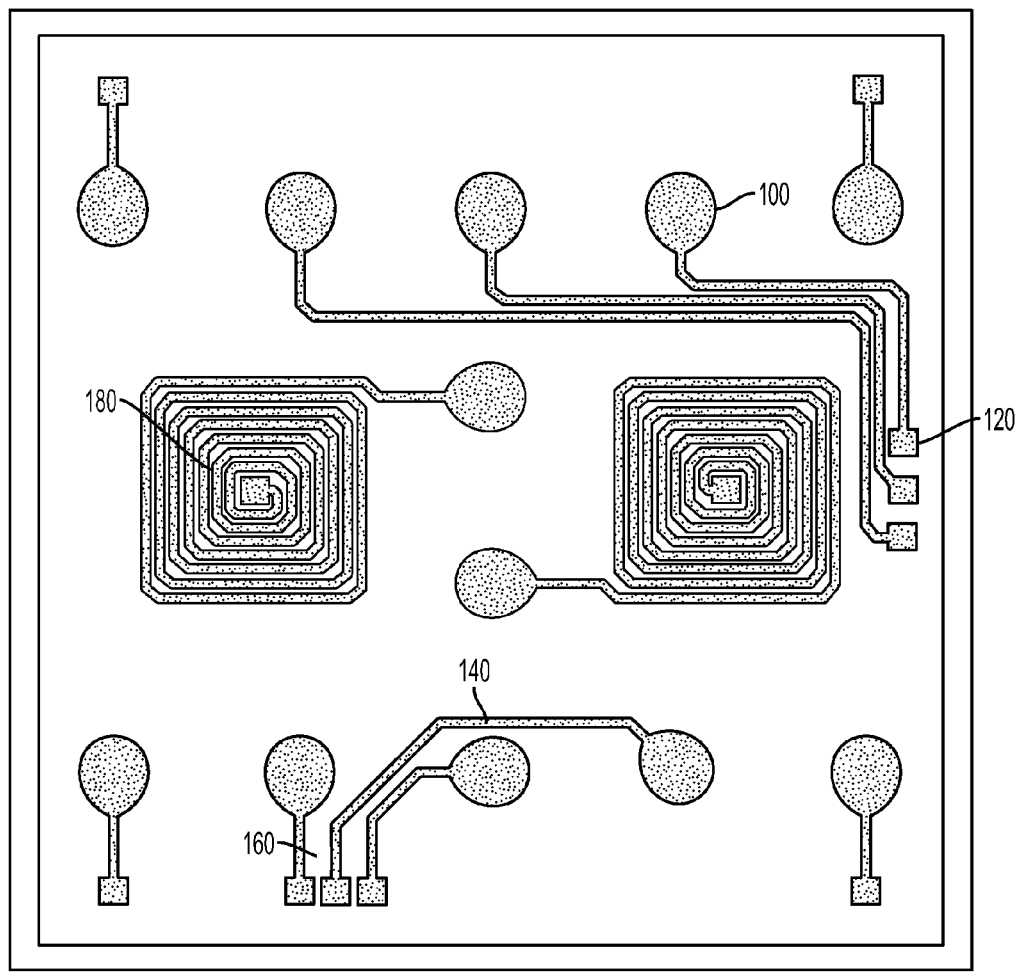
FIG. 1 illustrates a circuitry pattern typical of the RDL application with the original pad location 120 and the final pad location 100 connected with a metal conductor RDL line. A space between the lines is indicated 160 along with an RDL line 140 and an inductor circuit 180.
Figure 3:
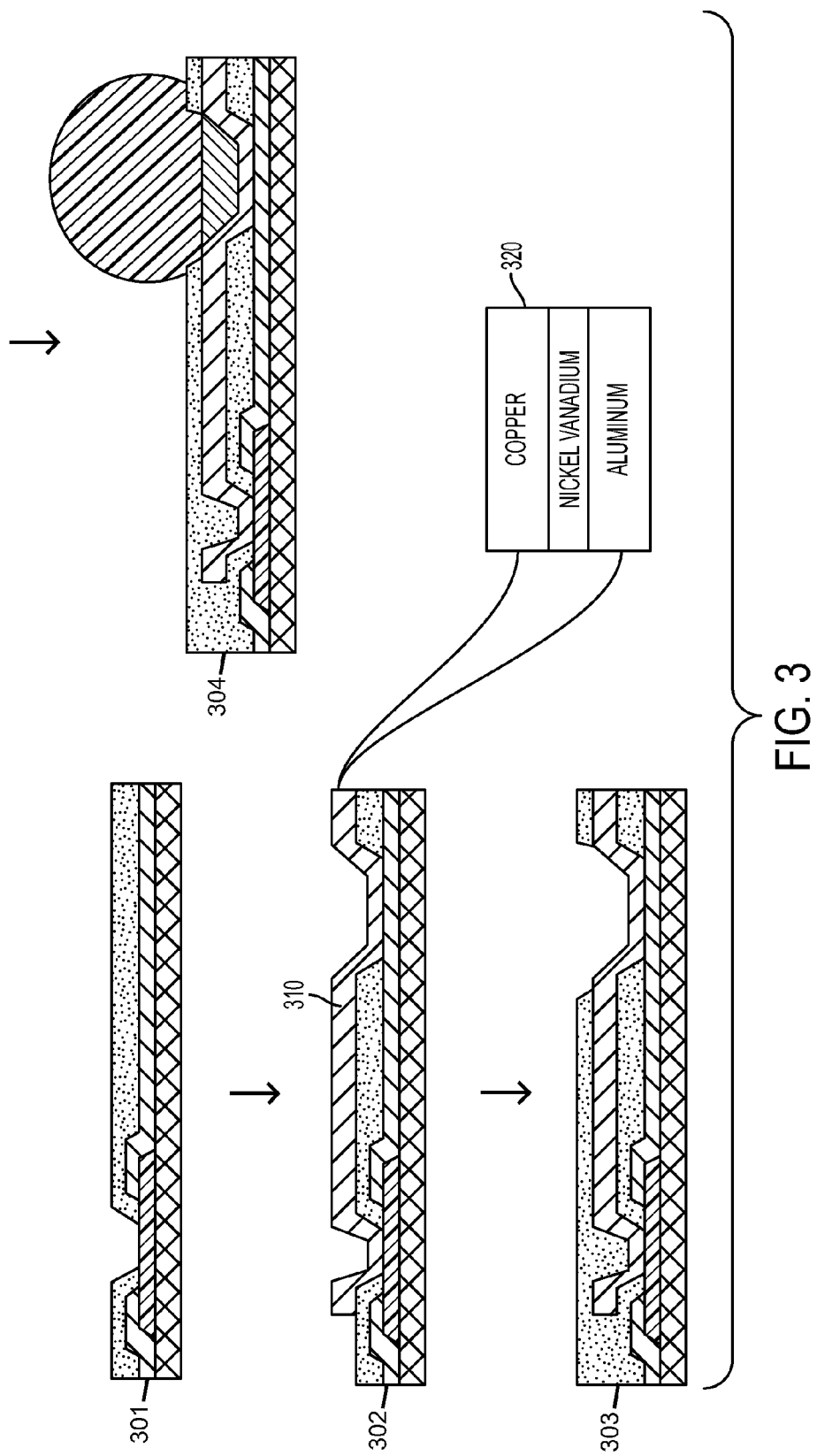
FIG. 3 illustrates a PVD thin film approach for formation of the RDL circuitry line 310 with a typical metal stack structure 320.
Figure 4:
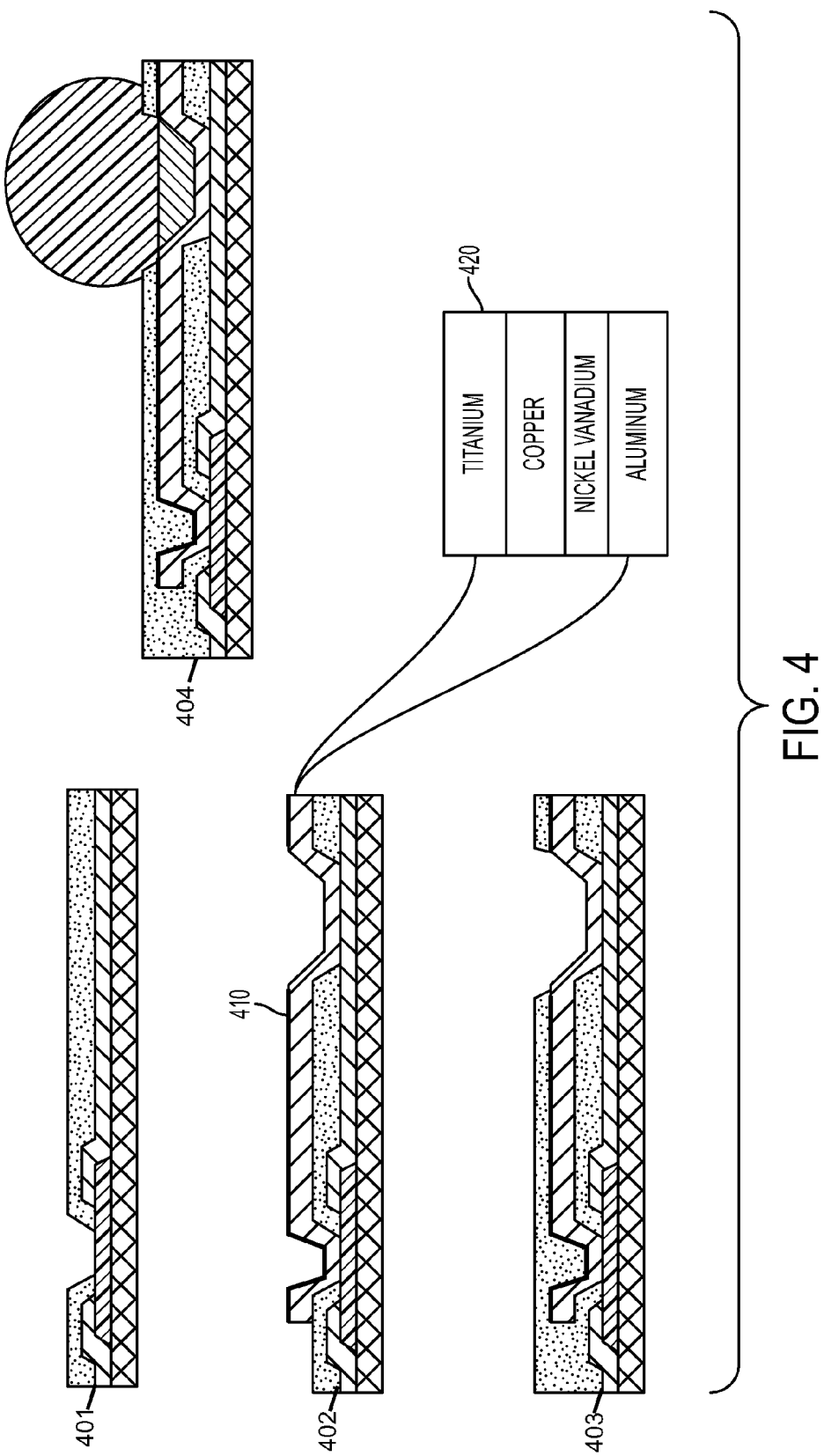
FIG. 4 illustrates an embodiment of a circuitry structure thin film approach having a circuitry runner 410 with a titanium enabled metal stack structure 420 in accordance with one or more embodiments of the present disclosure.

Referring now to FIG. 4, in an embodiment, a process for forming an RDL circuitry runner 410 with a titanium enabled metal stack structure 420 in accordance with one or more embodiments of the present disclosure is disclosed. The process illustrated by the structure 401 includes the operations of coating the first dielectric layer (Polymer 1), exposing, developing and curing. A subsequent process illustrated by the structure shown at 402 includes the operations of sputtering the metal redistribution seed layer with Aluminum, Nickel Vanadium, Copper and Titanium, and then patterning and etching to form redistribution and inductor runners. In one or more embodiments, the titanium enabled metal stack structure 420 for the seed layer comprises the following stacked layers: Aluminum approximately 10,000 Angstroms, Nickel Vanadium approximately 3,450 Angstroms; Copper approximately 8,350 Angstroms and Titanium approximately 250 Angstroms. With respect to the Titanium layer, a film of about 100 Angstroms to about 1500 Angstroms is possible, with the goal being for the layer to be as thin as it can be while providing the adhesion promotion and reliability functionality discussed herein. A process illustrated by structure 403 of FIG. 4 includes the operations of coating a second dielectric layer (Polymer 2), exposing, developing and curing. A process illustrated by structure 404 includes the operation of attaching a contact sphere.

Figure 5:
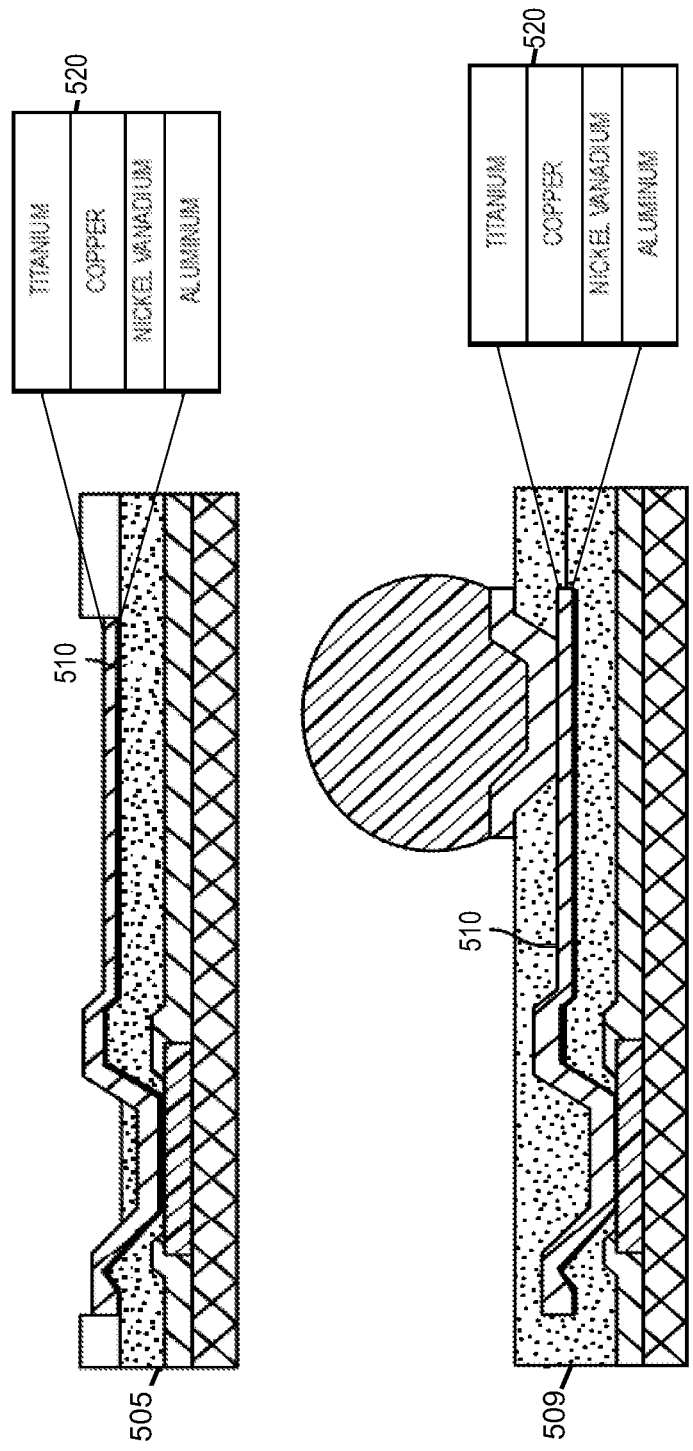
FIG. 5 illustrates an embodiment of a circuitry structure thin film approach having a plated copper RDL structure 510 with a titanium enabled metal stack structure 520 in accordance with one or more embodiments of the present disclosure.

FIG. 5 shows an embodiment wherein a titanium enabled metal stack structure 520 similar to that discussed above is used in a process for forming a plated copper RDL structure 510. In this respect, the titanium enabled metal stack structure 520 can be formed during an RDL copper electroplating step 505. An example of the complete structure is illustrated at 509.

Figure 6:
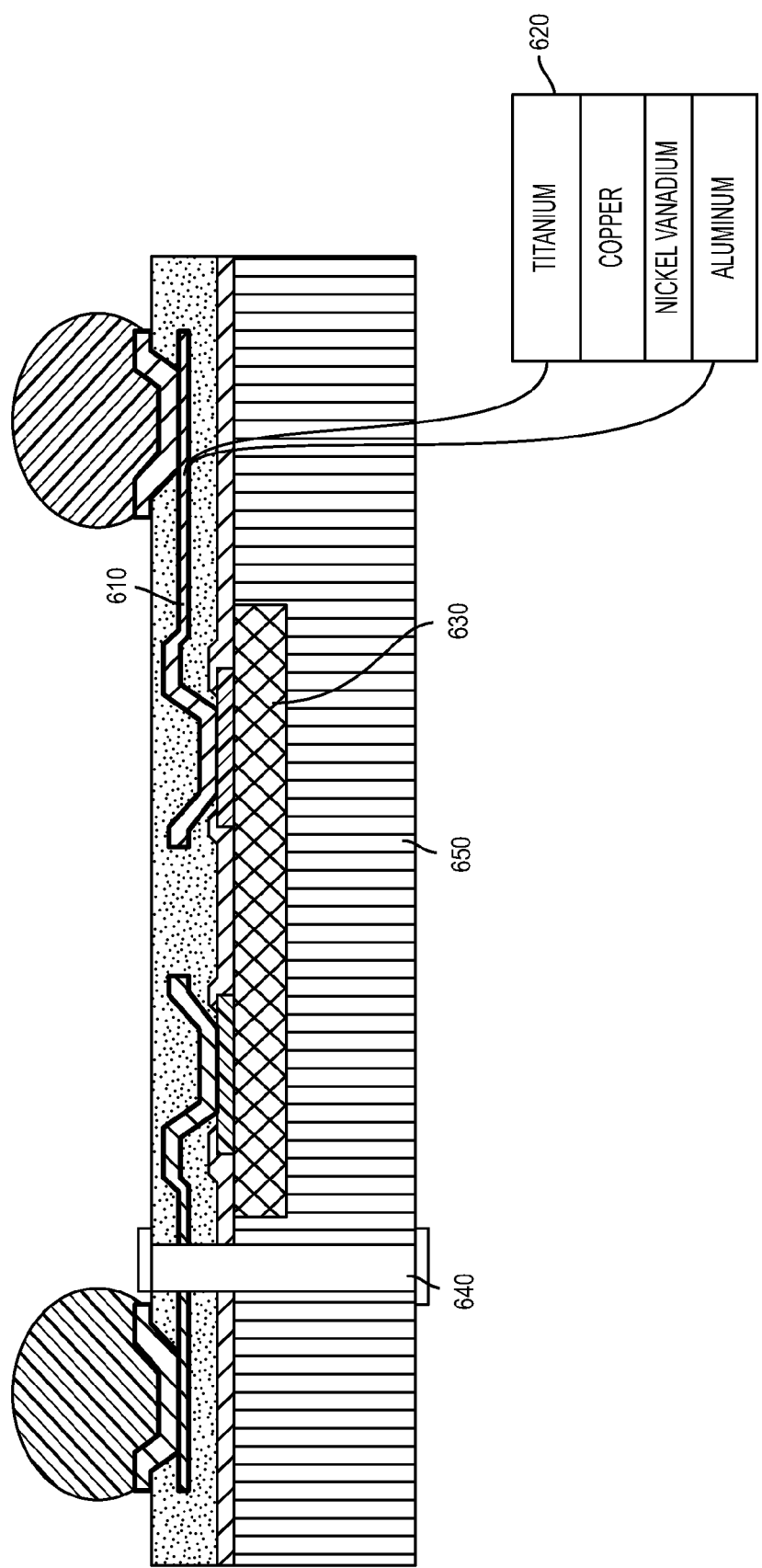
FIG. 6 illustrates an embedded die package with the wafer level circuitry 610, the metal stack with titanium 620, the embedded die 630 inside of the printed circuit substrate 650 and a typical through hole via 540 in accordance with one or more embodiments of the present disclosure.

FIG. 6 illustrates an embedded die package with wafer level redistribution circuitry in accordance with an embodiment of this disclosure. The wafer level redistribution circuitry 610 has a metal stack with titanium 620, the embedded die 630 inside of the printed circuit substrate 650 and a typical through hole via 640 formed in accordance with one or more embodiments of the present disclosure.

Because this structure, in an embodiment, utilizes titanium as an adhesion promoter that is immediately adjacent to the photoresist and because titanium has excellent adhesion during the subsequent etch process and polymer coating processes, the methods described herein enable the PVD process to achieve high yields for lines and spaces for geometries between 1 micron and 10 micron lines and spaces. It is also expected that the methods described herein will enable high yields below 1 micron lines and spaces.

In accordance with one or more embodiments, a new metal stack structure is provided for high density formation of circuitry utilizing titanium metal as top layer of the metal stack to promote adhesion during the subsequent photoresist and polymer coating operations, and to promote long term reliability of Wafer Level Packaging for inductors, antenna's and redistribution applications.

In accordance with one or more embodiments, the methods described herein can construct variously shaped complex interconnect structures including but not limited to circular, rectangular, octagonal, etc. In accordance with one or more embodiments, the methods described herein can provide high yields when forming antenna structures, coil structures, MEMs structures, inductor structures and rotor structures. In accordance with one or more embodiments, the methods described herein can provide high yields when forming interposers and 3D structures for stacking multiple die or discrete die in the same package.

In accordance with one or more embodiments, the methods described herein can provide high yields when forming embedded die structures for fan-out and other multi-die, multi-discrete 3D packages where the wafer level package is embedded in a printed circuit, a module, a packaging substrate or a flex circuit.

The above embodiments and preferences are illustrative of the present invention. It is neither necessary, nor intended for this patent to outline or define every possible combination or embodiment. The inventor has disclosed sufficient information to permit one skilled in the art to practice at least one embodiment of the invention. The above description and drawings are merely illustrative of the present invention and that changes in components, structure and procedure are possible without departing from the scope of the present invention as defined in the following claims. For example, elements and/or steps described above and/or in the following claims in a particular order may be practiced in a different order without departing from the invention. Thus, while the invention has been particularly shown and described with reference to embodiments thereof, it will be understood by those skilled in the art that various changes in form and details may be made therein without departing from the spirit and scope of the invention.

The invention claimed is:

1. A package, comprising:
   a wafer substrate;
   a metal stack seed layer comprising a titanium thin film outer layer; and,
   a resist layer in contact with said titanium thin film outer layer of said metal stack seed layer, said resist layer forming circuitry, wherein said circuitry comprises one or more embedded die structures.

2. The package according to claim 1, wherein said circuitry comprises wafer level redistribution circuitry.

3. The package according to claim 1, wherein said circuitry comprises one or more inductors.

4. The package according to claim 1, wherein said circuitry comprises one or more antennas.

5. The package according to claim 1, wherein the package comprises flip chip packaging.

6. The package according to claim 1, wherein said circuitry comprises one or more interconnect structures.

7. The package according to claim 6, wherein said interconnect structures have a shape that is circular, rectangular, or octagonal.

8. The package according to claim 1, wherein said circuitry comprises one or more coil structures.

9. The package according to claim 1, wherein said circuitry comprises one or more MEMs structures.

10. The package according to claim 1, wherein said circuitry comprises one or more rotor structures.

11. The package according to claim 1, wherein said embedded die structures comprise multi-die, multi-discrete 3D packages where a wafer level package is embedded in a printed circuit, a module, a packaging substrate or a flex circuit.

12. The package according to claim 1, wherein said titanium thin film outer layer has a thickness of between 100 Angstroms and 1500 Angstroms.

13. The package according to claim 1, wherein said titanium thin film outer layer has a thickness of 250 Angstroms.

14. A package, comprising:
    a wafer substrate;
    a metal stack seed layer comprising a titanium thin film outer layer; and
    a resist layer in contact with said titanium thin film outer layer of said metal stack seed layer, said resist layer forming circuitry, wherein said metal stack seed layer comprises an aluminum layer, a nickel vanadium layer, a copper layer, and said titanium thin film outer layer.

15. A method for manufacturing a package, comprising:
    forming a metal stack seed layer having a titanium thin film outer layer;
    forming a resist layer so as to be in contact with said titanium thin film outer layer of said metal stack seed layer; and
    forming circuitry from said resist layer;
    wherein said step of forming circuitry from said resist layer comprises:
    patterning said resist layer; and,
    etching said resist layer to form circuitry.

16. The method for manufacturing a package according to claim 15, wherein said circuitry comprises wafer level redistribution circuitry.

17. The method for manufacturing a package according to claim 15, wherein said circuitry comprises one or more inductors.

18. The method for manufacturing a package according to claim 15, wherein said circuitry comprises one or more antennas.

19. The method for manufacturing a package according to claim 15, wherein the package comprises flip chip packaging.

20. The method for manufacturing a package according to claim 15, wherein said circuitry comprises one or more interconnect structures.

21. The method for manufacturing a package according to claim 20, wherein said interconnect structures have a shape that is circular, rectangular, or octagonal.

22. The method for manufacturing a package according to claim 15, wherein said circuitry comprises one or more coil structures.

23. The method for manufacturing a package according to claim 15, wherein said circuitry comprises one or more MEMs structures.

24. The method for manufacturing a package according to claim 15, wherein said circuitry comprises one or more rotor structures.

25. The method for manufacturing a package according to claim 15, wherein said titanium thin film outer layer is formed to be between 100 Angstroms and 1500 Angstroms thick.

26. The method for manufacturing a package according to claim 15, wherein said titanium thin film outer layer is formed to be 250 Angstroms thick.

27. The method for manufacturing a package according to claim 15, further comprising the step of attaching a contact sphere.

28. A method for manufacturing a package, comprising:
    forming a metal stack seed layer having a titanium thin film outer layer;
    forming a resist layer so as to be in contact with said titanium thin film outer layer of said metal stack seed layer; and
    forming circuitry from said resist layer;
    wherein said circuitry comprises one or more embedded die structures.

29. The method for manufacturing a package according to claim 28, wherein said embedded die structures comprise multi-die, multi-discrete 3D packages where a wafer level package is embedded in a printed circuit, a module, a packaging substrate or a flex circuit.

30. A method for manufacturing a package, comprising:
    forming a metal stack seed layer having a titanium thin film outer layer;
    forming a resist layer so as to be in contact with said titanium thin film outer layer of said metal stack seed layer; and
    forming circuitry from said resist layer;
    wherein said step of forming a metal stack seed layer comprises sputtering aluminum, nickel vanadium, copper and said titanium thin film outer layer.

* * * * *